United States Patent
Furukawa et al.

(10) Patent No.: US 10,825,847 B2
(45) Date of Patent: Nov. 3, 2020

(54) SOLID-STATE IMAGING ELEMENT

(71) Applicant: Tower Partners Semiconductor Co., Ltd., Uozu (JP)

(72) Inventors: Katsuya Furukawa, Toyama (JP); Masahiro Oda, Hyogo (JP)

(73) Assignee: Tower Partners Semiconductor Co., Ltd., Uozu (JP)

( * ) Notice: Subject to any disclaimer, the term of this patent is extended or adjusted under 35 U.S.C. 154(b) by 18 days.

(21) Appl. No.: 16/195,436

(22) Filed: Nov. 19, 2018

(65) Prior Publication Data

US 2019/0088697 A1    Mar. 21, 2019

Related U.S. Application Data

(63) Continuation of application No. PCT/JP2017/017009, filed on Apr. 28, 2017.

(30) Foreign Application Priority Data

May 25, 2016    (JP) .................................. 2016-104071

(51) Int. Cl.
  *H01L 27/14*    (2006.01)
  *H01L 27/146*    (2006.01)
  (Continued)

(52) U.S. Cl.
  CPC ........ *H01L 27/14605* (2013.01); *G02B 5/201* (2013.01); *G02B 5/208* (2013.01);
  (Continued)

(58) Field of Classification Search
  CPC ......... H01L 27/14605; H01L 27/14621; H01L 27/1461; H04N 9/04553
  (Continued)

(56) References Cited

U.S. PATENT DOCUMENTS

6,852,565 B1 * 2/2005 Zhao ................ H01L 27/14632
                                                    438/200
2004/0169749 A1 * 9/2004 Acharya .................. H04N 5/33
                                                    348/279
(Continued)

FOREIGN PATENT DOCUMENTS

JP    2007-202107 A    8/2007
JP    2008-091753 A    4/2008
(Continued)

OTHER PUBLICATIONS

International Search Report for Application No. PCT/JP2017/017009, dated Jul. 11, 2017 in 4 pages.

*Primary Examiner* — Sheikh Maruf (74) *Attorney, Agent, or Firm* — Knobbe, Martens, Olson & Bear, LLP (57) ABSTRACT

A solid-state imaging element includes a plurality of shallow light receivers that are arrayed two-dimensionally in the vicinity of the surface of a semiconductor substrate and a plurality of deep light receivers that are arrayed two-dimensionally below the shallow light receivers. The shallow light receivers include visible light image light receivers that photoelectrically convert visible light and infrared light and output signals, and infrared light receivers that photoelectrically convert the infrared light. The infrared light receivers include a first infrared light receiver that is used to correct the signals output from the visible light image light receivers to provide signals of visible light components in the visible light image light receivers and a second infrared light receiver that is connected to the deep light receivers to form a multilayer light receiver.

8 Claims, 6 Drawing Sheets

(51) Int. Cl.
*H04N 9/04* (2006.01)
*H04N 5/33* (2006.01)
*G02B 5/20* (2006.01)

(52) U.S. Cl.
CPC ...... *H01L 27/1461* (2013.01); *H01L 27/1463* (2013.01); *H01L 27/1465* (2013.01); *H01L 27/14621* (2013.01); *H01L 27/14647* (2013.01); *H01L 27/14652* (2013.01); *H04N 5/33* (2013.01); *H04N 9/045* (2013.01); *H04N 9/04553* (2018.08)

(58) Field of Classification Search
USPC ........................................................ 257/432
See application file for complete search history.

(56) References Cited

U.S. PATENT DOCUMENTS

| | | | | |
|---|---|---|---|---|
| 2006/0084195 A1* | 4/2006 | Lyu | ................... | H01L 27/14603 438/48 |
| 2007/0285540 A1* | 12/2007 | Kwon | ................... | H04N 5/332 348/272 |
| 2008/0258155 A1* | 10/2008 | Chiba | ............... | H01L 31/02164 257/80 |
| 2010/0102366 A1* | 4/2010 | Lee | ................... | H01L 27/14609 257/291 |
| 2010/0148293 A1* | 6/2010 | Jain | ..................... | H01L 31/0203 257/434 |
| 2011/0074989 A1* | 3/2011 | Fossum | ................ | H04N 5/3696 348/273 |
| 2011/0205412 A1* | 8/2011 | Miyazaki | .......... | H01L 27/14621 348/294 |
| 2012/0018744 A1* | 1/2012 | Dosunmu | ............. | H01L 31/103 257/82 |
| 2012/0205649 A1* | 8/2012 | Hattori | ............. | H01L 27/14632 257/43 |
| 2012/0235265 A1* | 9/2012 | Takabayashi | ......... | H01L 31/105 257/432 |
| 2012/0257090 A1* | 10/2012 | Sa | .......................... | G02B 5/201 348/273 |
| 2012/0280344 A1* | 11/2012 | Shastri | ................. | G02B 6/4257 257/432 |
| 2013/0176396 A1* | 7/2013 | Cohen | ................. | H01L 27/1461 348/46 |
| 2014/0010496 A1* | 1/2014 | Tong | ................... | H01L 31/0232 385/14 |
| 2014/0070351 A1* | 3/2014 | Masuyama | ......... | H01L 31/0232 257/432 |
| 2015/0037048 A1* | 2/2015 | Na | .................. | H01L 31/022408 398/214 |
| 2015/0084143 A1* | 3/2015 | Fujikata | ............ | H01L 31/02327 257/432 |
| 2016/0365376 A1* | 12/2016 | Tashiro | ............ | H01L 27/14609 |

FOREIGN PATENT DOCUMENTS

| | | |
|---|---|---|
| JP | 2009-272620 A | 11/2009 |
| JP | 2010-041031 A | 2/2010 |
| WO | 2012/004934 A1 | 1/2012 |

* cited by examiner

| B | G | B | G | B | G | B | G |
|---|---|---|---|---|---|---|---|
| IR1 | R | IR2 | R | IR1 | R | IR2 | R |
| B | G | B | G | B | G | B | G |
| IR1 | R | IR2 | R | IR1 | R | IR2 | R |
| B | G | B | G | B | G | B | G |
| IR1 | R | IR2 | R | IR1 | R | IR2 | R |
| B | G | B | G | B | G | B | G |
| IR1 | R | IR2 | R | IR1 | R | IR2 | R |

SOLID-STATE IMAGING ELEMENT

CROSS-REFERENCE TO RELATED APPLICATIONS

This is a continuation of International Application No. PCT/JP2017/017009 filed on Apr. 28, 2017, which claims priority to Japanese Patent Application No. 2016-104071 filed on May 25, 2016. The entire disclosures of these applications are incorporated by reference herein.

BACKGROUND

General solid-state imaging elements that are used for digital still cameras, camera-equipped smartphones, and other similar devices include a photodiode designed to have sensitivity to a visible light region that is perceived by human eyes. In recent years, many image sensors that can acquire both of images in the visible light region and images in an infrared region have been proposed. In particular, in the case of a sensor including a silicon substrate, an absorption coefficient of infrared rays by silicon is lower than that of visible light. Thus, a contrivance has been proposed to improve infrared sensitivity.

For example, Japanese Unexamined Patent Publication No. 2009-272620 (Patent Document 1) discloses the following technique. Specifically, a photodiode (a third light receiver) that photoelectrically converts infrared rays (IR) is extended below photodiodes (a first light receiver and a second light receiver) that photoelectrically convert visible light and white (W) light, respectively, to improve infrared sensitivity.

When the photodiode is extended as in the method disclosed in Japanese Unexamined Patent Publication No. 2009-272620, the absorption coefficient of the infrared rays is increased, thereby improving the infrared sensitivity. In the case of the configuration in which an infrared light receiver is laminated on red, green, and blue (RGB) pixels, the infrared light receiver is typically used without any infrared ray cut filter to enhance the infrared sensitivity. A region of the silicon substrate for use in the solid-state imaging element up to a depth of approximately 1100 nm entirely has sensitivity to the infrared light. Accordingly, when the infrared light is incident on the element, most of the infrared light is detected by a lower second light receiver but part of the infrared light is detected by an upper first light receiver, in each of RGB pixels. As a result, the infrared output is added to the output of each RGB pixel to cause deterioration in color reproducibility, resulting in generation of an image with unnatural colors.

SUMMARY

In view of the foregoing background, a description will be given of an imaging element that can acquire a preferable image causing no image deterioration due to deterioration in color reproducibility even while having a configuration in which an infrared pixel extends below a visible pixel.

A solid-state imaging element according to an aspect of the present disclosure includes: a plurality of shallow light receivers that are arrayed two-dimensionally in the vicinity of a surface of a semiconductor substrate; and a plurality of deep light receivers that are arrayed two-dimensionally below the shallow light receivers. The shallow light receivers include at least one visible light image light receiver that photoelectrically converts visible light and infrared light and outputs a signal, and an infrared light receiver that photoelectrically converts the infrared light. The infrared light receiver includes a first infrared light receiver that is used to correct the signal output from the at least one visible light image light receiver to provide a signal based on a visible light component in the at least one visible light image light receiver, and a second infrared light receiver that is connected to the deep light receiver to form a multilayer light receiver.

The solid-state imaging element of the present disclosure can provide the signal of the visible light component in the visible light image light receiver as the shallow light receiver formed in the vicinity of the surface of the semiconductor substrate. In addition, the solid-state imaging element can provide a signal of an infrared light component in the deep light receiver provided below the shallow light receivers. Accordingly, high-quality images with the infrared light and the visible light can be simultaneously provided.

DETAILED DESCRIPTION

Embodiments of a technique of the present disclosure will now be described with reference to the drawings.

Figure 1:
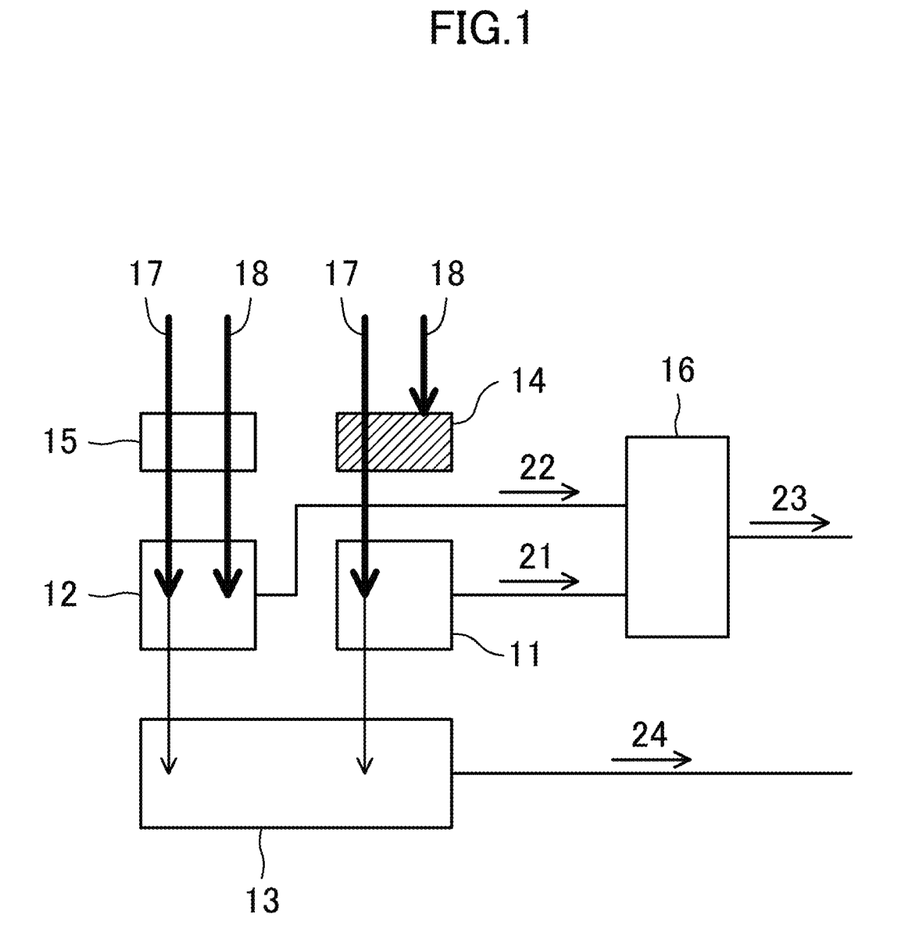
FIG. 1 is a schematic view for explaining basic functions of a solid-state imaging element of the present disclosure.

FIG. 1 is a schematic view for explaining basic functions of a solid-state imaging element of the embodiment. The solid-state imaging element includes a semiconductor substrate, and further includes an infrared light receiver 11 and a visible light image light receiver 12 as light receivers (shallow light receivers) provided in the vicinity of the surface of the semiconductor substrate. The solid-state imaging element further includes a deep light receiver 13 below these shallow light receivers. The infrared light receiver 11 includes a color filter 14 which blocks visible light 18 and through which infrared light 17 transmits. The visible light image light receiver 12 includes a color filter 15 through which both of the visible light 18 and the infrared light 17 transmit. Although FIG. 1 illustrates only one type of the color filter 15 of the visible light image light receiver 12, a plurality of visible light image light receivers 12 may include a plurality of types of color filters through which only components of visible light within a wavelength region corresponding to wavelengths of predetermined colors transmit. That is to say, in order to acquire a color image, the visible light image light receiver 12 may include any of color filters (through which the infrared light transmits) corresponding to colors such as RGB (red, green, blue).

The infrared light receiver 11 in which the color filter 14 blocks the visible light 18 can absorb part of the incident infrared light 17, photoelectrically convert the part of the light, and output a charge signal 21. The other part of the infrared light 17 passes through the infrared light receiver 11 without being photoelectrically converted, and reaches the deep light receiver 13 below the infrared light receiver 11.

Both of the infrared light 17 and the visible light 18 are incident on the visible light image light receiver 12. The visible light image light receiver 12 photoelectrically converts the visible light 18 and part of the visible light 17, so that the visible light image light receiver 12 can output a charge signal 22 containing components corresponding to the visible light 18 and the part of the infrared light 17. The other part of the infrared light 17 passes through the visible light image light receiver 12, and reaches the deep light receiver 13 below the visible light image light receiver 12, in the same manner as the case of the infrared light receiver 11.

In the example illustrated in FIG. 1, part of the infrared light 17 that has passed through the visible light image light receiver 12 and part of the infrared light 17 that has passed through the infrared light receiver 11 are incident on the same deep light receiver 13. Accordingly, the deep light receiver 13 can output a charge signal 24 corresponding to the sum of the part of the infrared light 17 and the part of the infrared light 17.

As described above, substantially only the infrared light 17 is incident on the deep light receiver 13 because the visible light 18 is blocked by the color filter 14 or is absorbed by the visible light image light receiver 12. The ratio of part of the infrared light 17 absorbed by the shallow light receivers (the visible light image light receiver 12 and the infrared light receiver 11) is relatively low. Accordingly, the solid-state imaging element can acquire a preferable image with the infrared light based on the charge signal 24 that the deep light receiver 13 outputs.

By contrast, the charge signal 22 that the visible light image light receiver 12 outputs contains a component of the visible light 18 and a component of part of the infrared light 17. Accordingly, when an image is assumed to be acquired based on the charge signal 22, the component of the infrared light is added to provide an image with lower color reproducibility, for example. The infrared light 17 incident on the visible light image light receiver 12 and that on the infrared light receiver 11 sufficiently close to each other may have similar intensities. A charge signal 23 corresponding to the component of the visible light 18 in the visible light image light receiver 12 can be provided by correcting the charge signal 22 from the visible light image light receiver 12 with the charge signal 21 from the infrared light receiver 11. FIG. 1 schematically illustrates a signal corrector 16 that performs this correction. Although in a simple example, the charge signal 21 may be subtracted from the charge signal 22, a more appropriate correction method may be used if possible.

As described above, although the infrared light 17 is also incident on the visible light image light receiver 12, an image based on the component of the visible light 18 can be acquired while the influence of the infrared light 17 is eliminated. Since no color filter blocking the infrared light 17 is used, the amount of the infrared light 17 incident on the deep light receiver 13 increases. Thus, an infrared image excellent in sensitivity can be acquired.

The charge signals 22 from the visible light image light receivers 12 may be corrected using the electric charge signal 21 output from one infrared light receiver 11. For example, if a pixel including three visible light image light receivers 12 corresponding to R, G, and B, respectively, and the one infrared light receiver 11 is formed, signals from the three visible light image light receivers 12 included in the same pixel may be all corrected by the one infrared light receiver 11 in the same pixel.

First Embodiment

Configuration of Solid-State Imaging Element

Figure 2:
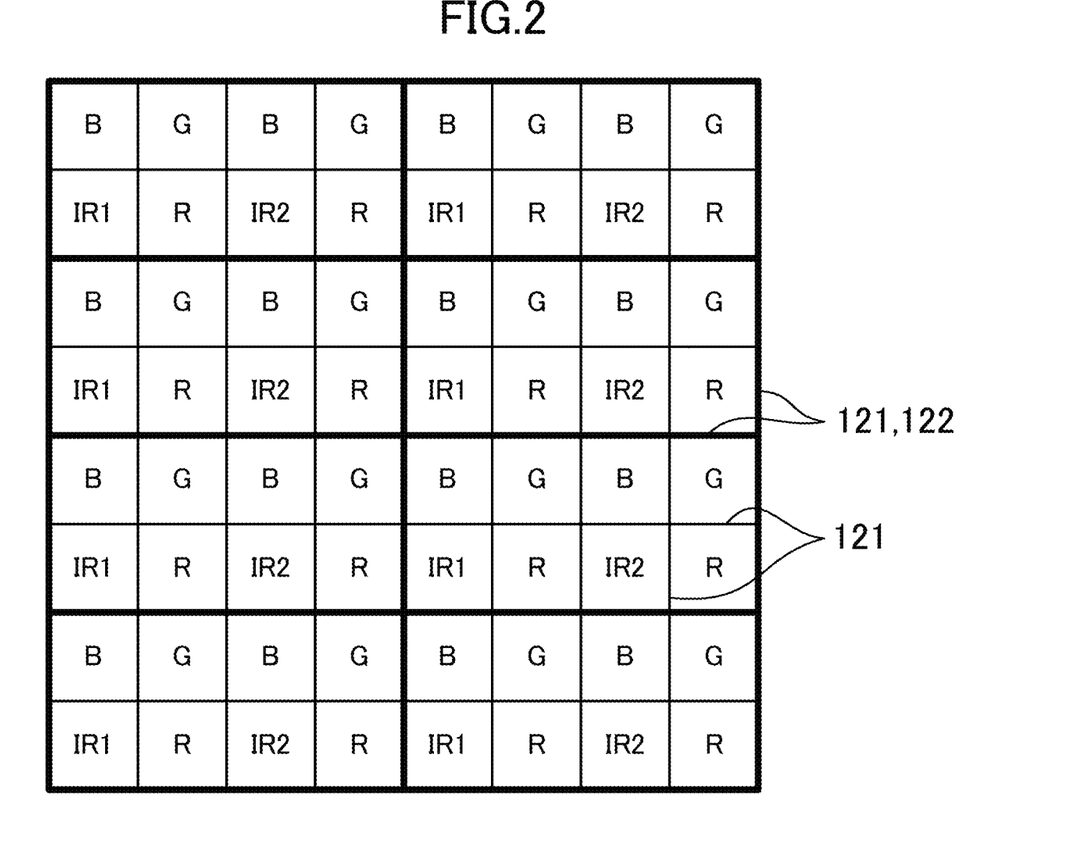
FIG. 2 is a schematic view showing a two-dimensional array of light receivers in an exemplary solid-state imaging element according to a first embodiment of the present disclosure.

Next, a more specific solid-state imaging element will be described with reference to FIGS. 2 to 4. FIG. 2 illustrates an array of light receivers of an exemplary solid-state imaging element 100.

As illustrated in FIG. 2, the light receivers are two-dimensionally arrayed on the semiconductor substrate made of silicon or any other suitable material, and each light receiver includes any one of color filters respectively corresponding to four colors, i.e., a red (R) visible light component, a green (G) visible light component, a blue (B) visible light component, and an infrared light (IR) component. The color filters form a color filter layer in which four color filters arranged in two rows and two columns are repeatedly arrayed as a unit. The IR filters are classified into two IR filters, i.e., IR1 and IR2 filters, but the filters themselves are made of the same material. The configurations of the light receivers including the respective filters are different from each other as will be described below. It should be noted that the IR filters allow the infrared light to transmit therethrough, and block the visible light. Each of the RGB visible light filters allows the infrared light in addition to the visible light of an associated color (within an associated wavelength region) to transmit therethrough.

Figure 3:
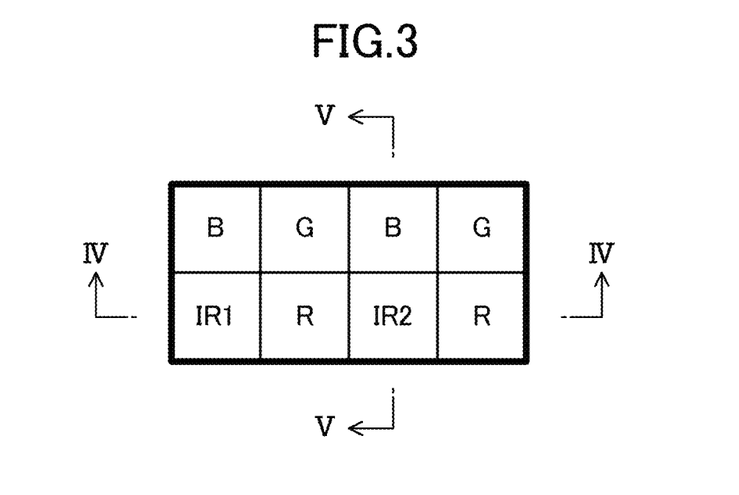
FIG. 3 shows eight extracted light receivers in FIG. 2.

FIG. 3 illustrates eight extracted light receivers arranged in two rows and four columns in FIG. 2. The solid-state imaging element 100 includes such eight light receivers arranged in two rows and four columns as the basic configuration.

Figure 4:
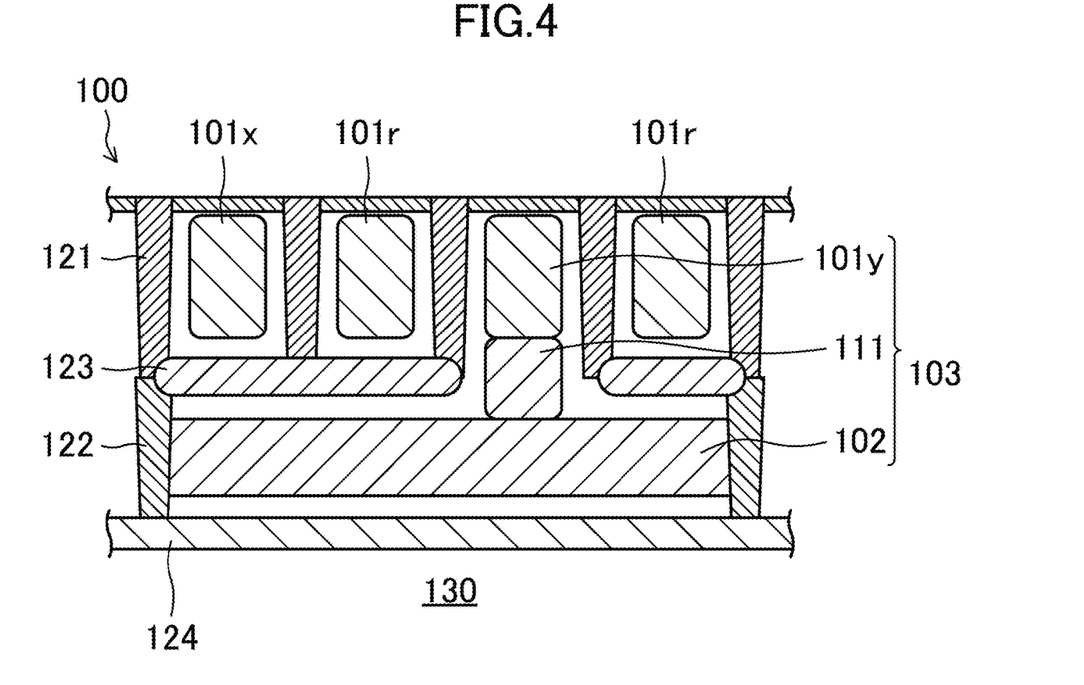
FIG. 4 schematically illustrates a cross section of the solid-state imaging element taken along line IV-IV in FIG. 3.
Figure 5:
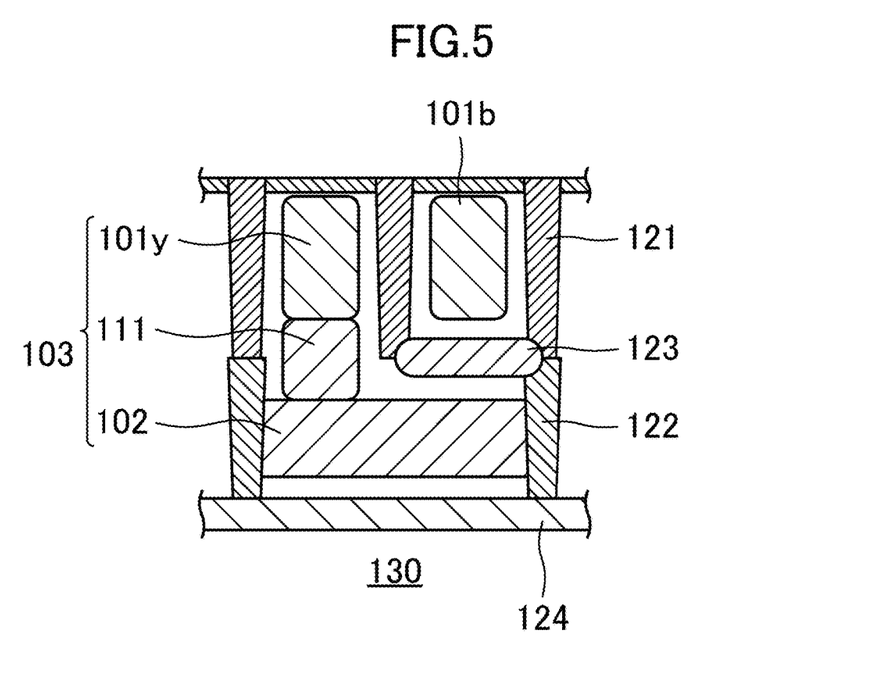
FIG. 5 schematically illustrates a cross section of the solid-state imaging element taken along line V-V in FIG. 3.

FIGS. 4 and 5 schematically illustrate cross sections of the solid-state imaging element 100 taken along line VI-VI and line V-V in FIG. 3, respectively. As illustrated in these drawings, the solid-state imaging element 100 includes shallow light receivers 101 (as which visible light image light receivers 101r, 101g, 101b, 101x, and 101y described later are collectively referred to) formed in the vicinity of the surface of a semiconductor substrate 130 and deep light receivers 102 formed below the shallow light receivers 101.

In the case of the exemplary solid-state imaging element 100, each deep light receiver 102 extends below the eight shallow light receivers 101 arranged in four rows and two columns, and is connected through a connector 111 to one (a second infrared light receiver 101y) of the shallow light receivers that includes the IR2 filter to form a multilayer light receiver 103.

Among the other shallow light receivers 101 that do not form the multilayer light receiver 103, the shallow light receivers 101 each of which includes the color filter of any one of RGB colors form visible light image light receivers 101r, 101g, and 101b. However, the color filters of RGB colors allow the infrared light to also transmit therethrough as described above. Accordingly, the infrared light is also incident on the visible light image light receivers, which absorb, and photoelectrically convert, part of the infrared light. The other part of the infrared light passes through the visible light image light receivers, and is absorbed by the deep light receiver 102 located below the visible light image light receivers. The visible light is mostly absorbed by the visible light image light receivers, and is substantially not incident on the deep light receiver 102.

Among the other shallow light receivers 101 that do not form the multilayer light receiver 103, the shallow light receiver 101 including the IR1 filter forms a first infrared light receiver 101x. The shallow light receiver 101 forming part of the multilayer light receiver 103 is the second infrared light receiver 101y. The IR filters (IR1 and IR2) block the visible light. This substantially prevents the visible light from being incident on the first infrared light receiver 101x and the second infrared light receiver 101y.

A shallow horizontal separator 121 is provided between each adjacent pair of the shallow light receivers 101. In other words, the shallow light receivers 101 are arranged two-dimensionally with the shallow horizontal separator 121 interposed between each adjacent pair of the shallow light receivers 101. A deep horizontal separator 122 is provided between each adjacent pair of the deep light receivers 102. In other words, the deep light receivers 102 are arranged two-dimensionally with the deep horizontal separator 122 interposed between each adjacent pair of the deep light receivers 102. Vertical separators 123 are provided between the shallow light receivers 101 and the deep light receivers 102. These separators separate the light receivers from each other. Furthermore, a vertical overflow barrier 124 that separates the deep light receivers 102 from the semiconductor substrate 130 located below the deep light receivers 102 is provided below the deep light receivers 102.

With the above-mentioned layout, all of the four light receivers that include the first infrared light receiver 101x and the three visible light image light receivers, i.e., the RGB light receivers and the IR1 light receivers, are formed in the shallow light receivers 101 only. On the other hand, among the four light receivers that include the second infrared light receiver 101y and the three visible light image light receivers, i.e., the RGB light receivers and the IR1 light receivers, the second infrared light receiver 101y is connected to the deep light receiver 102, and the other visible light image light receivers are formed in the shallow light receivers 101 only.

Acquisition of Visible Light Image and Infrared Light Image

How a visible light image and an infrared light image are acquired by the solid-state imaging element 100 according to the embodiment will now be described. In the solid-state imaging element 100, the visible light image (RGB image) is acquired using the visible light image light receivers 101r, 101g, and 101b as the shallow light receivers 101, and the infrared light image is acquired using the multilayer light receiver 103 including the deep light receiver 102 as a part thereof. When the visible light image and the infrared light image are taken simultaneously, imaging is performed using no infrared ray cut filter that substantially prevents infrared rays from being incident on the solid-state imaging element 100. As a result, the visible light image light receivers absorb some of the infrared rays to cause deterioration in image quality in terms of the color reproducibility and other elements, as described above.

Among the shallow light receivers 101 including the IR filters, the first infrared light receiver 101x that is not connected to the deep light receiver 102 is used to correct the infrared light components of signals output from the visible light image light receivers 101r, 101g, and 101b. That is to say, in addition to the visible light of the predetermined colors (wavelength regions), the infrared light is incident on the visible light image light receivers 101r, 101g, and 101b, and electric charges containing the visible light components and the infrared light components are thus generated in the light receivers through photoelectric conversion. In this case, only the infrared light is incident on the first infrared light receiver 101x because the IR filter blocks the visible light. Thus, electric charges of the infrared light component are generated in the first infrared light receiver 101x through photoelectric conversion.

When the eight light receivers illustrated in FIG. 3 are used as the basic configuration, the eight light receivers are sufficiently close to one another. The intensities of the infrared light incident on the respective visible light image light receivers 101r, 101g, and 101b among the eight light receivers can be brought closer to the intensity of the infrared light incident on the first infrared light receiver 101x. Thus, electric charge signals based on only the visible light components can be provided by subtracting the electric charge signal based on the infrared light component that is generated in the first infrared light receiver 101x from the electric charge signals based on the visible light components and the infrared light components that are generated in the visible light image light receivers 101r, 101g, and 101b. Accordingly, even when no infrared ray cut filter is used, a high-quality visible light image in which the influence of the infrared rays has been eliminated can be acquired.

The second infrared light receiver 101y is used for the infrared light image. The second infrared light receiver 101y is connected to the deep light receiver 102 through the connector 111 to form the multilayer light receiver 103. The infrared rays pass through the IR1 filter, and are incident on the second infrared light receiver 101y, and some of the infrared rays are photoelectrically converted, whereas most of the infrared rays passes through the second infrared light receiver 101y, is incident on the deep light receiver 102, and is photoelectrically converted in the deep light receiver 102. Part of the infrared light incident on the visible light image light receivers and the first infrared light receiver 101x is also photoelectrically converted in the light receivers, whereas most of the infrared light reaches the deep light receiver 102 and is photoelectrically converted in the deep light receiver 102. In the solid-state imaging element 100, the deep light receiver 102 is formed below the shallow light receivers 101 so as to correspond to the eight light receivers illustrated in FIG. 3, and can photoelectrically convert the infrared rays incident in the range to output the converted infrared rays as the electric charge signal. Thus, a photoelectric conversion region corresponding to the eight light receivers can be utilized, so that sensitivity to the incidence of the infrared rays can be enhanced. The electric charge signal of the infrared rays can be read in a reading operation through the connector 111 and the second infrared light receiver 101y.

As can be seen from the foregoing description, when the visible light image and the infrared light image are simultaneously acquired, the solid-state imaging element 100 can substantially prevent deterioration in the color reproducibility and other elements of the visible light image and enhance the sensitivity of the infrared light image without using any infrared light cut filter.

Implantation Layouts of Solid-State Imaging Element

Next, a layout of implantation in a method for manufacturing the solid-state imaging element 100 will be described with reference to FIG. 6.

Figure 6:
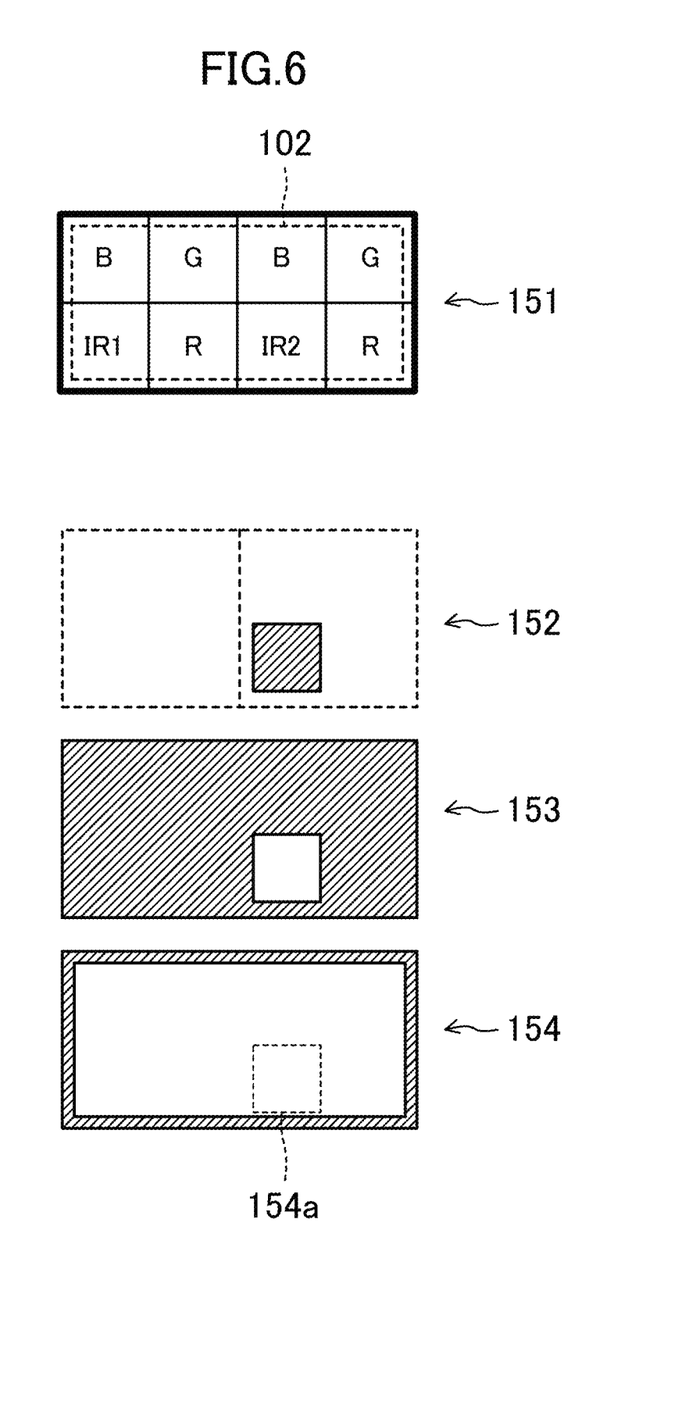
FIG. 6 illustrates layouts of injection during fabrication of the solid-state imaging element in FIG. 2.

In FIG. 6, reference numeral 151 denotes eight light receivers including the first infrared light receiver 101x, the second infrared light receiver 101y, and the visible light image light receivers 101r, 101g, and 101b (two for each). These light receivers are formed by implanting N-type impurities into the semiconductor substrate 130. P-type impurities are implanted into the semiconductor substrate to separate these light receivers from each other to form the shallow horizontal separators 121.

Reference numeral 152 denotes a layout of implantation for forming the connector 111. That is to say, only a region corresponding to the second infrared light receiver 101y including the IR2 filter is patterned, and N-type impurities are implanted into the region to form the connector 111, which connects the second infrared light receiver 101y and the deep light receiver 102 together to form the multilayer light receiver 103.

Reference numeral 153 denotes a layout of implantation for forming the vertical separator 123. That is to say, a region other than the second infrared light receiver 101y is patterned, and P-type impurities are implanted into this region to separate the shallow light receivers 101 from the deep light receiver 102 in the region other than the second infrared light receiver 101y.

Reference numeral 154 denotes a layout of implantation for forming the deep horizontal separator 122. Reference numeral 154a denotes the position of the second infrared light receiver 101y. The deep horizontal separator 122 is formed by patterning to surround the eight light receivers, as a unit, denoted by reference numeral 151 and implanting the P-type impurities around the eight light receivers. Thus, the deep horizontal separator 122 separates the range corresponding to the eight shallow light receivers 101.

The above-mentioned implantation enables the formation of the solid-state imaging element 100 according to the embodiment.

Second Embodiment

Next, a second embodiment of the present disclosure will be described.

As illustrated in FIG. 6 and other figures, in the case of the solid-state imaging element 100 according to the first embodiment, each deep horizontal separator 122 is provided below the eight shallow light receivers 101 as a unit so as to correspond to the eight shallow light receivers 101. The deep horizontal separator 122 is connected to the second infrared light receiver 101y. Accordingly, the second infrared light receiver 101y is localized on one side of a range of the deep horizontal separator 122.

As a result, distances to the position of the second infrared light receiver 101y significantly vary depending on positions in the deep light receiver 102. For example, a distance to the position of the second infrared light receiver 101y from the position of the visible light image light receiver 101b (including the B filter) illustrated in an upper left portion of the layout 151 in FIG. 6 is much greater than a distance thereto from the position of the visible light image light receiver 101r (including the R filter) illustrated in a lower right portion of the layout 151. When the distance is greater, a distance for transferring electric charges is increased, and it is therefore disadvantageous in terms of the transfer. For example, the transfer of the electric charges cannot be completed within a necessary period of time, and the electric charges may remain undesirably to cause residual images and deterioration in image quality.

Figure 7:
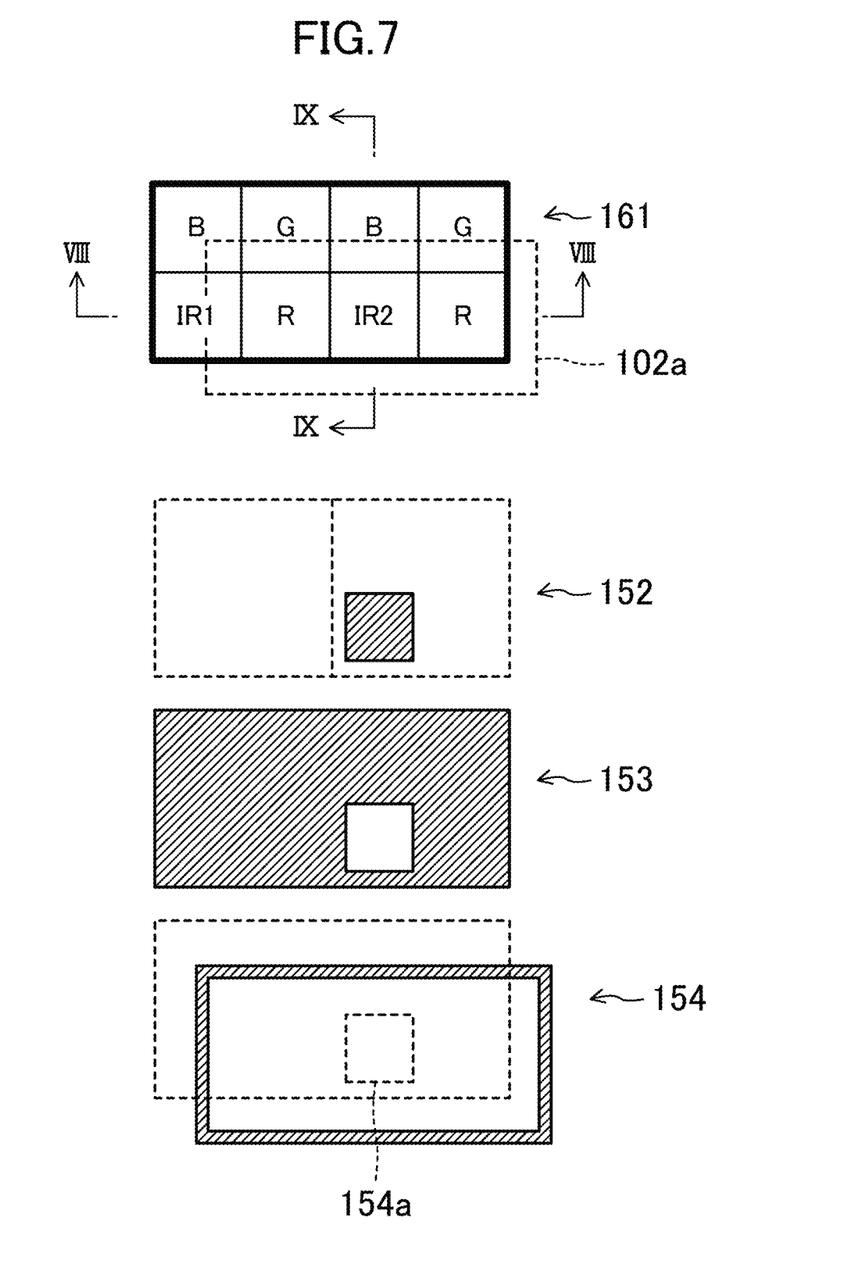
FIG. 7 illustrates a layout of injection during fabrication of a solid-state imaging element according to a second embodiment of the present disclosure.
Figure 8:
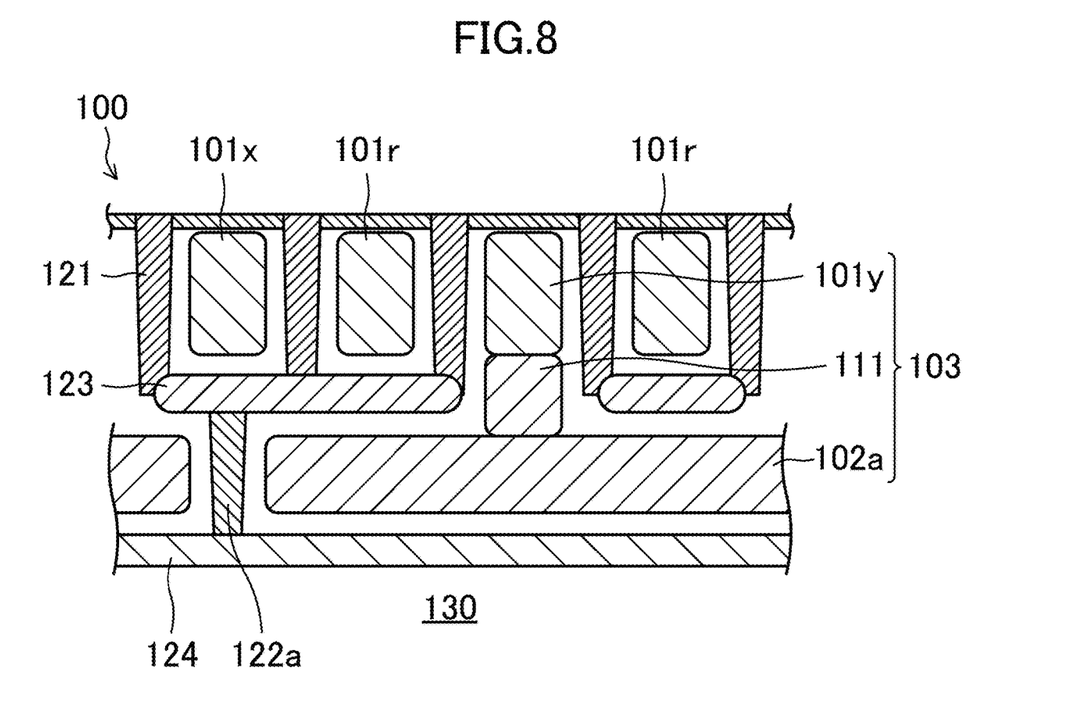
FIG. 8 schematically illustrates a cross section of the solid-state imaging element taken along line VIII-VIII in FIG. 7.
Figure 9:
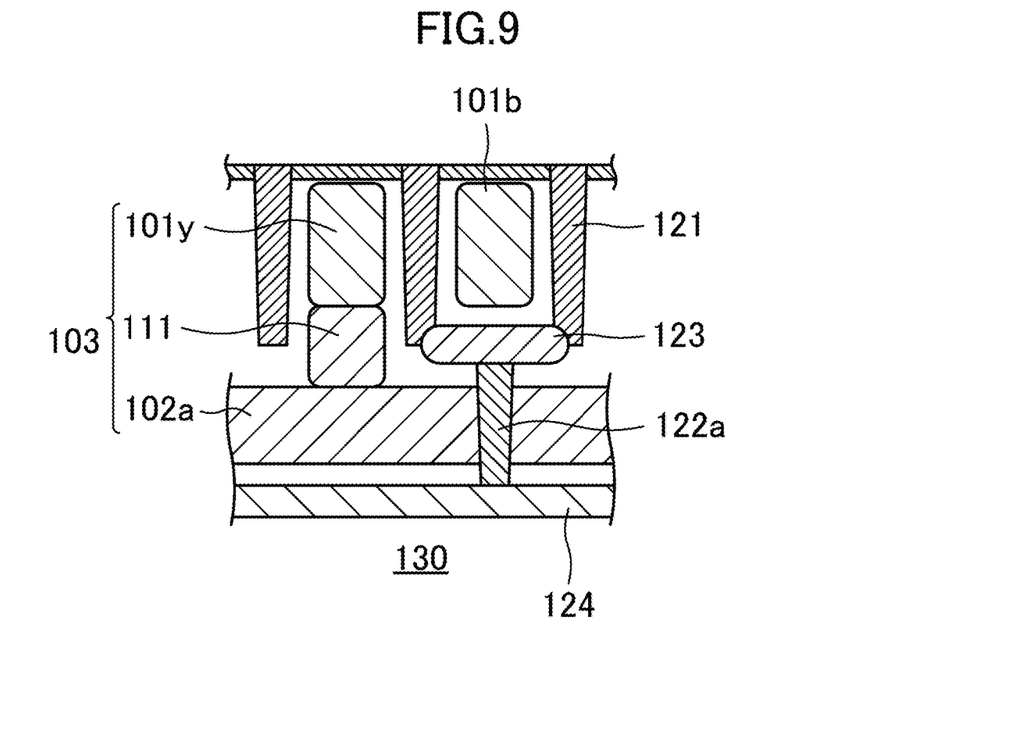
FIG. 9 schematically illustrates a cross section of the solid-state imaging element taken along line IX-IX in FIG. 7.

To address this problem, a solid-state imaging element 200 according to the embodiment has a structure illustrated in FIGS. 7, 8, and 9. The solid-state imaging element 200 is similar to the solid-state imaging element 100 in the first embodiment in that it includes shallow light receivers 101, deep light receivers 102, and other components. The solid-state imaging element 200 differs from the solid-state imaging element 100 in a layout of the shallow light receivers 101 and the deep light receivers 102 on a plan view (how the shallow light receivers 100 overlap with the deep light receivers 102).

FIG. 7 illustrates a layout of the solid-state imaging element 200 on a plan view, and corresponds to FIG. 6 in the first embodiment. FIGS. 8 and 9 illustrate schematic cross sections taken along line VIII-VIII and line IX-IX in FIG. 7, respectively.

As illustrated in FIGS. 8 and 9, the shallow light receivers 101, the shallow horizontal separators 121, and the vertical separators 123 of the solid-state imaging element 200 are similar to those of the solid-state imaging element 100.

On the other hand, each deep light receiver 102a has an area corresponding to the eight shallow light receivers 101 but is arranged such that the second infrared light receiver 101y is located at the center thereof (see a layout 161 in FIG. 7). Accordingly, the layout of each deep horizontal separator 122a also differs from that in the solid-state imaging element 100 (see a layout 154 in FIG. 7).

As a result, in comparison with the case of the solid-state imaging element 100 (the layout 151 in FIG. 6), the differences among the distances to the second infrared light receiver 101y from positions in the deep horizontal separator 122 are reduced. Consequently, deterioration in image quality due to residual images and other factors can be substantially prevented.

Although the deep light receiver 102a is formed in a rectangular shape corresponding to the eight shallow light receivers 101 also in the embodiment, it does not need to be formed in a rectangular shape (for example, it may be formed in a square shape or any other shape), and does not always need to have an area corresponding to the eight shallow light receivers 101.

The solid-state imaging element of the present disclosure has the function of eliminating infrared light components from a visible light image, and is useful as a solid-state imaging element capable of simultaneously taking a visible light image and an infrared light image with high quality.

What is claimed is:

1. A solid-state imaging element comprising:
a plurality of shallow light receivers that are arrayed two-dimensionally in the vicinity of a surface of a semiconductor substrate; and
a plurality of deep light receivers that are arrayed two-dimensionally below the shallow light receivers, wherein
the shallow light receivers include at least one visible light image light receiver that photoelectrically converts visible light and infrared light and outputs a signal, and an infrared light receiver that photoelectrically converts the infrared light,
the infrared light receiver includes a first infrared light receiver that is used to correct the signal output from the at least one visible light image light receiver to provide a signal based on a visible light component in the at least one visible light image light receiver, and a second infrared light receiver that is connected to the deep light receiver to form a multilayer light receiver, and the first infrared light receiver is separated from the deep light receiver.

2. The solid-state imaging element of claim 1, wherein the deep light receivers are each provided to extend below the adjacent shallow light receivers.

3. The solid-state imaging element of claim 2, wherein the deep light receivers are each provided to correspond to eight adjacent ones of the shallow light receivers, and the eight shallow light receivers include four of the shallow light receivers including the first infrared light receiver and the at least one visible light image light receiver comprising three visible light image light receivers corresponding to red light, green light, and blue light, respectively, and four of the shallow light receivers including the second infrared light receiver and the at least one visible light image light receiver comprising four visible light image light receivers corresponding to red light, green light, and blue light, respectively.

4. The solid-state imaging element of claim 2, wherein the deep light receivers are each provided such that the second infrared light receiver is located at a center of the deep light receiver.

5. The solid-state imaging element of claim 2, further comprising
a signal corrector that provides the signal with only the visible light component in the visible light image light receiver by subtracting, from the signal containing the visible light component output from the visible light image light receiver and the infrared light component, an infrared light component of a signal output through photoelectric conversion by the first infrared light receiver included in the same adjacent shallow light receivers.

6. The solid-state imaging element of claim 1, further comprising
a color filter layer including color filters provided in the respective shallow light receivers, wherein
the color filter of the visible light image light receiver allows both of the visible light and the infrared light to transmit therethrough, and
the color filter of the infrared light receiver blocks the visible light and allows the infrared light to transmit therethrough.

7. The solid-state imaging element of claim 6, wherein the color filter layer includes, as a set of color filters, four types of color filters including three types of color filters each of which is provided in the visible light image light receiver and corresponds to any one of red light, green light, or blue light and the infrared light and a color filter provided in the infrared light receiver and corresponding to the infrared light.

8. The solid-state imaging element of claim 1, wherein
the shallow light receivers absorb part of the incident infrared light,
the deep light receiver absorbs the infrared light that has passed through the shallow light receivers, and
the multilayer light receiver photoelectrically converts the infrared light that has been absorbed by the second infrared light receiver and the deep light receiver forming the multilayer light receiver and outputs a signal.

* * * * *